United States Patent
Oiyama

(10) Patent No.: US 6,373,120 B1
(45) Date of Patent: Apr. 16, 2002

(54) SEMICONDUCTOR DEVICE FOR SIMULTANEOUSLY ACHIEVING HIGH RELIABILITY TO LASER LIGHT RADIATION AND SMALL OCCUPATION REGION AND METHOD OF MANUFACTURING IT

(75) Inventor: Tomoya Oiyama, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/246,833

(22) Filed: Feb. 8, 1999

(30) Foreign Application Priority Data

Dec. 2, 1998 (JP) ............................................. 10-029798

(51) Int. Cl.⁷ ............................................. H01L 29/00
(52) U.S. Cl. ...................................... 257/529; 257/209
(58) Field of Search ................................. 257/529, 536, 257/538, 173, 665, 209, 530; 438/281, 333, 467, 601, 132, 215

(56) References Cited

U.S. PATENT DOCUMENTS

| | | | | |
|---|---|---|---|---|
| 4,403,399 A | * | 9/1983 | Taylor | 438/328 |
| 4,598,462 A | * | 7/1986 | Chandrasekhar | 438/333 |
| 4,723,155 A | * | 2/1988 | Uchida | 257/529 |
| 4,907,058 A | * | 3/1990 | Sakai | 257/371 |
| 5,166,901 A | * | 11/1992 | Shaw et al. | 365/105 |
| 5,348,907 A | * | 9/1994 | Migita | 438/202 |
| 5,457,336 A | * | 10/1995 | Fang et al. | 257/322 |
| 5,521,413 A | * | 5/1996 | Narita | 257/355 |
| 5,585,662 A | * | 12/1996 | Ogawa | 257/529 |
| 5,675,174 A | * | 10/1997 | Nakajima et al. | 257/529 |
| 5,903,041 A | * | 5/1999 | La Fleur et al. | 257/530 |
| 6,046,488 A | * | 4/2000 | Kawasaki et al. | 257/529 |
| 6,080,928 A | * | 6/2000 | Nakagawa | 136/249 |

FOREIGN PATENT DOCUMENTS

| | | |
|---|---|---|
| JP | 3-83361 | 4/1991 |
| JP | 5-41481 | 2/1993 |
| JP | 7-211779 | 8/1995 |
| JP | 8-204129 | 8/1996 |

* cited by examiner

Primary Examiner—Eddie Lee
Assistant Examiner—José R Díaz
(74) Attorney, Agent, or Firm—Hutchins, Wheeler & Dittmar

(57) ABSTRACT

A semiconductor device includes a first semiconductor layer, a first well, a second semiconductor layer, a second well, an insulating layer, a fuse layer, and an insulating layer. The first well is formed in a surface of the first semiconductor layer. The second semiconductor layer is formed on the first semiconductor layer. The second well is formed in the second semiconductor layer to be wider than the first well in a lateral direction. The insulating layer is formed on the second semiconductor layer. The fuse layer is formed on the insulating layer. The insulating layer is formed on the fuse layer such that a part of the fuse layer is exposed.

21 Claims, 7 Drawing Sheets

SEMICONDUCTOR DEVICE FOR SIMULTANEOUSLY ACHIEVING HIGH RELIABILITY TO LASER LIGHT RADIATION AND SMALL OCCUPATION REGION AND METHOD OF MANUFACTURING IT

BACKGROUND OF THE INVENTION

1. Field of the Invention

The present invention relates to a semiconductor device and more particularly, to a semiconductor device for simultaneously achieving high reliability to laser light radiation and small occupation region and method of manufacturing it.

2. Description of the Related Art

This type of semiconductor device is provided in, for example, a power source wire to supply a power source to a circuit. The semiconductor device is used when the supply of the power source to the circuit is stopped as necessary. The function of the semiconductor device is executed by cutting off a wiring layer constituting a fuse connected to the power supply wire by a laser light. The conventional semiconductor device will be described below.

FIG. 1 shows a semiconductor device disclosed in Japanese Laid Open Patent Application (JP-A-Heisei 5-41481) (hereafter, referred to as a conventional technique 1). It is intended to easily adjust the strength of a laser light to be radiated. A field oxide film 42 is formed on a P-type semiconductor substrate 41. Moreover, a first interlayer insulating film 43 and a second interlayer insulating film 44 are formed on the field oxide film 42.

A polysilicon film 45 as a fuse element is formed on the first interlayer insulating film 43. The polysilicon film 45 is connected through contacts 48-1, 48-2 to wires 46-1, 46-2 formed of aluminum. The whole element is covered with a cover film 47. An opening 49 is formed in the cover film 47 and the second interlayer insulating film 44. The laser light is radiated to the opening 49 to cut off the polysilicon film 45.

At this time, the strength of the laser light must be finely adjusted. The reason is described below. If the radiated laser light penetrates not only the polysilicon film 45 but also the first interlayer insulating film 43 and the field oxide film 42 and further reaches the P-type semiconductor substrate 41, there may be a possibility that the polysilicon film 45 and the P-type semiconductor substrate 41 are in contact with each other.

When they are in contact with each other, if it is assumed that the wire 46-1 or 46-2 is supplied with a bias voltage Vcc and the semiconductor substrate 41 is biased to a ground potential GND, a leakage current is generated.

Thus, in this semiconductor device, an N-type diffusion layer 40 having a conductive type opposite to that of the semiconductor substrate 41 is formed in the semiconductor substrate 41 below the opening 49. According to such a configuration, even if the laser light is slightly strong, the insulation between the wires 46-1 and 46-2 and the semiconductor substrate 41 is kept unless the laser light penetrates the N-type diffusion layer 40. That is, if the polysilicon film 45 becomes in contact with the N-type diffusion layer 40, the portion between the N-type diffusion layer 40 and the semiconductor substrate 41 is in the state of PN converse junction. Hence, the leakage current does not flow.

The similar semiconductor device is disclosed in Japanese Laid Open Patent Application (JP-A-Heisei 7-211779) (hereafter, referred to as a conventional technique 2). In this device, fuses 55-1, 55-2 are provided above an N-well 56 formed in a P-type semiconductor substrate 51, as shown in FIGS. 2A and 2B. Moreover, P-type wells 50-1, 50-2 are formed to prevent these fuses 55-1, 55-2 from becoming in contact with the N-type well 56 when the fuses 55-1, 55-2 are cut off.

Incidentally, the reference number 52 denotes a field oxide film, 53 denotes an interlayer insulating film and 54 denotes a cover film. In the semiconductor device, it is not desirable that the N-type well 56 and the like are kept in floating states since the charges accumulated in the N-type well 56 may cause the potential of the P-type semiconductor substrate 51 to be changed. Hence, the N-type well 56 is biased through the contacts 57 to the bias potential Vcc.

In these conventional techniques 1 and 2, it is difficult to simultaneously achieve the improvement of the reliability to the laser light radiation and the miniaturization of the semiconductor device. In this case, the improvement of the reliability to the laser light radiation is to reduce the possibility that the leakage current flows when the fuse is in contact with the semiconductor substrate (or the well).

In the conventional technique 1, the N-type diffusion layer 40 must be deeply formed to attain the high reliability. However, when the thermomigration is performed for a long time to form deeply the diffusion layer, the diffusion layer is expanded even in a lateral direction.

The diffusion layer is usually biased to a certain potential as described in the explanation of the conventional technique 2. Typically, the diffusion layer is biased to the bias potential Vcc in the case of the N-type diffusion layer formed in the P-type semiconductor substrate, and it is biased to the ground potential GND in the case of the P-type diffusion layer formed in the N-type semiconductor substrate.

Hence, the range to implant an impurity to form the diffusion layer is determined to overlap a position of the contact of the wire to supply the bias voltage to the diffusion layer. The position of the contact is set to a position apart from the opening 49 by considering the dispersion of fragment when the laser light is radiated and the like.

If the diffusion layer is deeply formed, the diffusion layer is further expanded in the periphery from the position of the contact formed in the position apart from the opening 49. This causes the region occupied by the semiconductor device to be made larger.

In the conventional technique 2, the P-type wells 50-1, 50-2 are originally formed in the N-type well 56. Thus, the P-type wells 50-1, 50-2 can not be formed extremely deeply. To deeply form the P-type wells 50-1, 50-2, the N-type well 56 must be made deeper. If the N-type well 56 is formed deeply, the problem similar to that of the conventional technique 1 is brought about. Moreover, if the P-type wells 50-1, 50-2 are biased, the problem similar to that of the conventional technique 1 is also brought about. Furthermore, if the laser light penetrates the N-type well 56, the fuse 55 and the P-type semiconductor substrate 51 become in contact with each other and the leakage current flows.

A semiconductor device described below is disclosed in Japanese Laid Open Patent Application (JP-A-Heisei 8-204129). This semiconductor device is provided with a well 12 having a conductive type opposite to that of a silicon substrate 11, an insulating layer 13 formed on the well 12 and a laser trimming wiring layer 14 formed on the insulating layer 13.

However, the approach to solve the above-mentioned subjects in the present invention is not disclosed in the semiconductor device disclosed in Japanese Laid Open Patent Application (JP-A-Heisei 8-204129).

Moreover, a semiconductor device described below is disclosed in Japanese Laid Open Patent Application (JP-A-Heisei 3-83361). This semiconductor device is provided with a semiconductor substrate having a first conductive type, a diffusion layer having a second conductive type that is opposite to the first conductive type formed in the semiconductor substrate, an insulating film formed above the diffusion layer and the semiconductor substrate, and a cutoff fuse formed on the insulating film on the diffusion layer.

However, the approach to solve the above-mentioned subjects in the present invention is not disclosed in the semiconductor device disclosed in Japanese Laid Open Patent Application (JP-A-Heisei 3-83361).

SUMMARY OF THE INVENTION

The present invention is made to solve the above-described problems in the related arts as mentioned above.

The present invention is accomplished to solve the above-mentioned problem. Therefore, an object of the present invention is to provide a device for simultaneously achieving high reliability to laser light radiation and small occupation region and method of manufacturing it.

To achieve an aspect of the present invention, a semiconductor device includes a first semiconductor layer, a first well formed in a surface of the first semiconductor layer, a second semiconductor layer formed on the first semiconductor layer, a second well formed in the second semiconductor layer to be wider than the first well in a lateral direction, an insulating layer formed on the second semiconductor layer, a fuse layer formed on the insulating layer and an insulating layer formed on the fuse layer such that a part of the fuse layer is exposed.

In this case, a depth of the first well is deeper than that of the second well.

Also in this case, the fuse layer is a polysilicon film.

Further in this case, the semiconductor device further includes electrodes formed outside the exposure portion of the fuse layer.

In this case, the electrodes are connected to the second well.

Also in this case, the electrodes are connected to each other through the insulating layer to allow the first well and the second well to be biased.

In this case, the first well and the second well may be in contact with each other.

Also in this case, the first semiconductor layer and the second semiconductor layer may be formed as a single semiconductor layer.

In this case, the first and second wells have a conductive type opposite to those of the first semiconductor layer and the second semiconductor layer.

Also in this case, the first well is formed to have a first surface plane portion in the first semiconductor layer, and the exposure portion of the fuse layer is formed above the first surface plane portion.

In order to achieve another aspect of the present invention, the first well is formed to have a first surface plane portion in the first semiconductor layer, and the second well is formed to have a second surface plane portion in the second semiconductor layer, and at least a part of the first surface plane portion is formed to overlap a part of the second surface plane portion.

In order to achieve further aspect of the present invention, the first well is formed to have a first surface plane portion in the first semiconductor layer, and the second well is formed to have a second surface plane portion in the second semiconductor layer, and a whole of the first surface plane portion is formed to overlap a part of the second surface plane portion.

In order to achieve still another aspect of the present invention, the first well is formed to have a first surface plane portion in the first semiconductor layer, and the second well is formed to have a second surface plane portion in the second semiconductor layer, and a whole of the first surface plane portion is formed to substantially overlap a whole of the second surface plane portion.

In order to achieve yet still another aspect of the present invention, the second well is formed to have a second surface plane portion in the second semiconductor layer, and the second surface plane portion is formed to be externally In order to achieve another aspect of the present invention, the second well is formed to have a second surface plane portion in the second semiconductor layer, and the semiconductor device further includes electrodes formed at laterally internal portions of the second surface plane portion.

In this case, the electrodes are connected to each other through the insulating layer to allow the first well and the second well to be biased.

Also in this case, the second well is formed to have a second surface plane portion in the second semiconductor layer, and the semiconductor device further comprises a bias voltage supplying wire formed laterally outside the exposure portion of the fuse layer, and laterally inside the second surface plane portion, wherein the bias voltage supplying wire supplies a bias voltage to the first well and the second well.

In order to achieve still another aspect of the present invention, a semiconductor device includes a fuse layer, an insulating layer formed below the fuse layer, a semiconductor layer formed below the insulating layer, protecting section formed between the insulating layer and the semiconductor layer for protecting a current from flowing into the semiconductor layer, bias section for supplying a bias voltage and connecting section for connecting the bias section to the protecting section, while protecting the current from flowing into the semiconductor layer.

In this case, the protecting section and the connecting section protect a leakage current from flowing from the fuse layer to the semiconductor layer when a laser light emitted to the fuse layer penetrates the insulating layer.

Also in this case, the connecting section is formed such that a surface plane portion of the protecting section is smaller than that of the connecting section.

In order to achieve yet still another aspect of the present invention, a method of manufacturing a semiconductor device, includes the steps of selectively injecting an impurity having a first conductive type into a semiconductor substrate having a second conductive type which is opposite to the first conductive type, performing a thermomigration of the injected impurity to form a first well having the first conductive type, selectively injecting an impurity having the first conductive type into an overlapping region to form a second well shallower than the first well, at least a part of the overlapping region overlapping the first well and forming a fuse element above the second well and above the first well.

In this case, the step of selectively injecting the impurity having the first conductive type into the overlapping region includes injecting the impurity having the first conductive type into an region wider than the formed first well as the overlapping region.

Also in this case, the method of manufacturing a semiconductor device further includes the step of injecting an impurity having the second conductive type into the semiconductor substrate after the step of performing the thermomigration of the injected impurity and before the step of selectively injecting the impurity having the first conductive type into the overlapping region.

Further in this case, the method of manufacturing a semiconductor device further includes the step of forming an exposure portion of the formed fuse element above the first well.

Also in this case, the method of manufacturing a semiconductor device further includes the step of forming a bias voltage supplying wire laterally outside the first well and inside the second well to supply a bias voltage to the first well and the second well.

BRIEF DESCRIPTION OF THE DRAWINGS

A more complete understanding of the present invention is made of reading a detailed description in conjunction with the accompanying drawings, in which.

DESCRIPTION OF THE PREFERRED EMBODIMENTS

Referring now to drawings, various preferred embodiments of the present invention will be described in detail.

Figure 1:
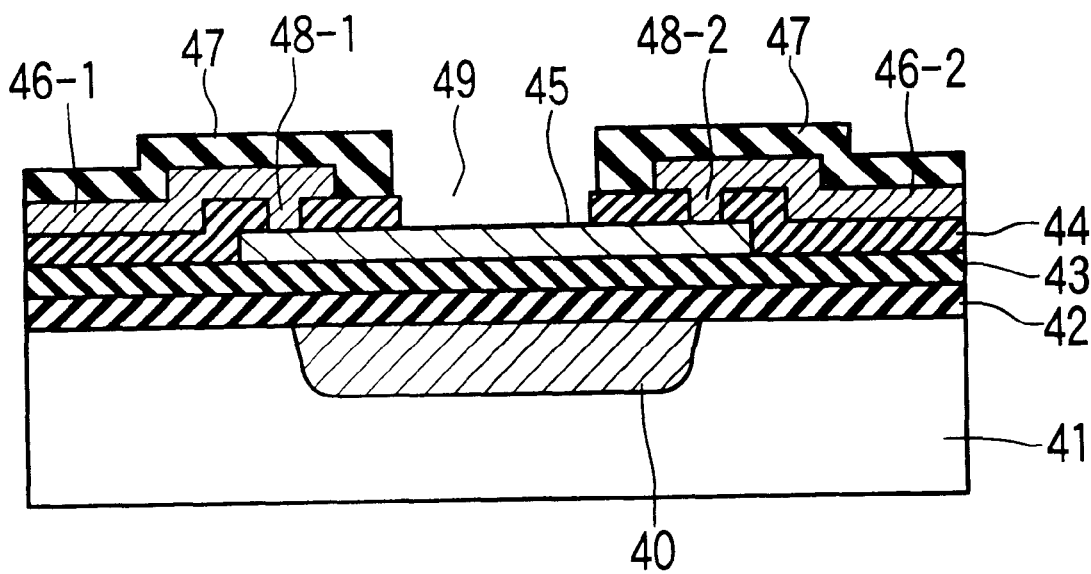
FIG. 1 is a section view showing a conventional technique 1.
Figure 2A:
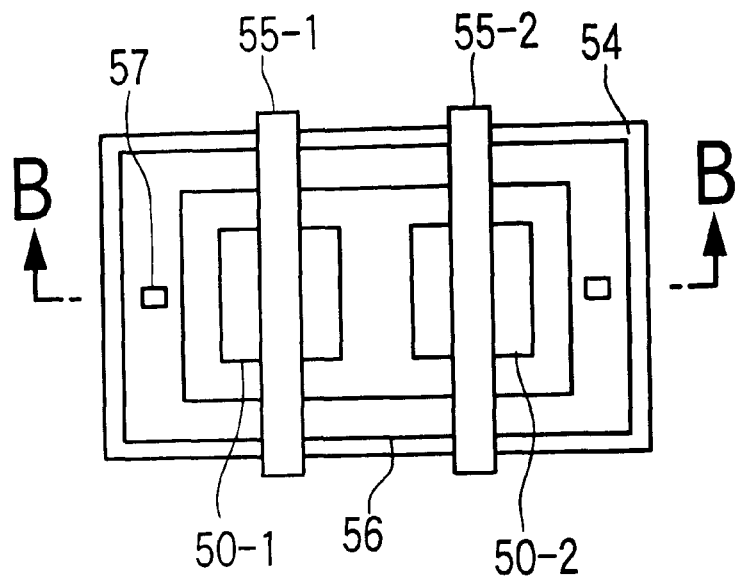
FIG. 2A is a plan view showing a conventional technique 2.
Figure 2B:
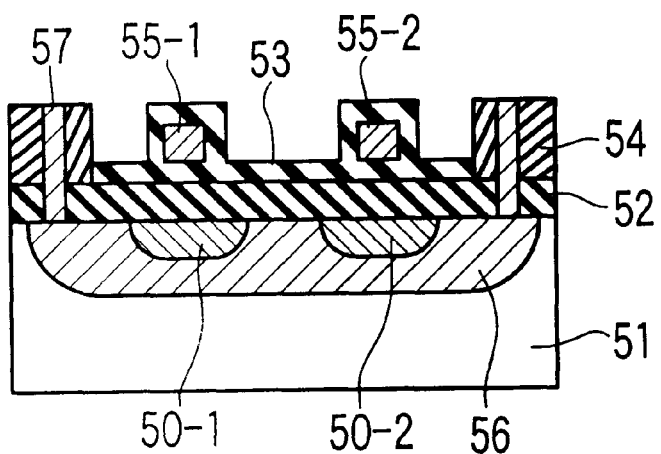
FIG. 2B is a section view showing the conventional technique 2.
Figure 3A:
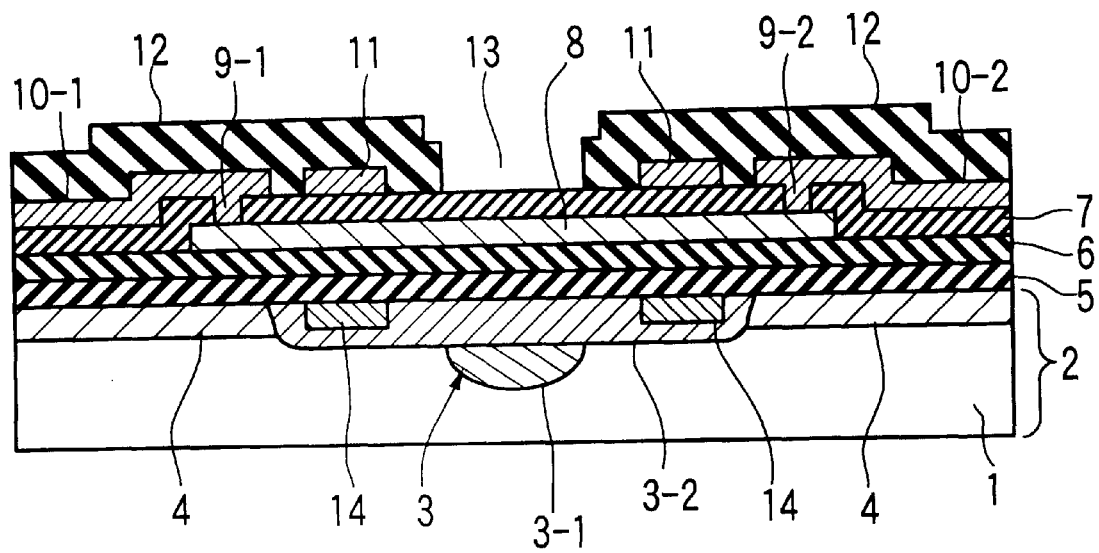
FIG. 3A shows a first embodiment in the present invention taken on the line A—A of FIG. 4.
Figure 3B:
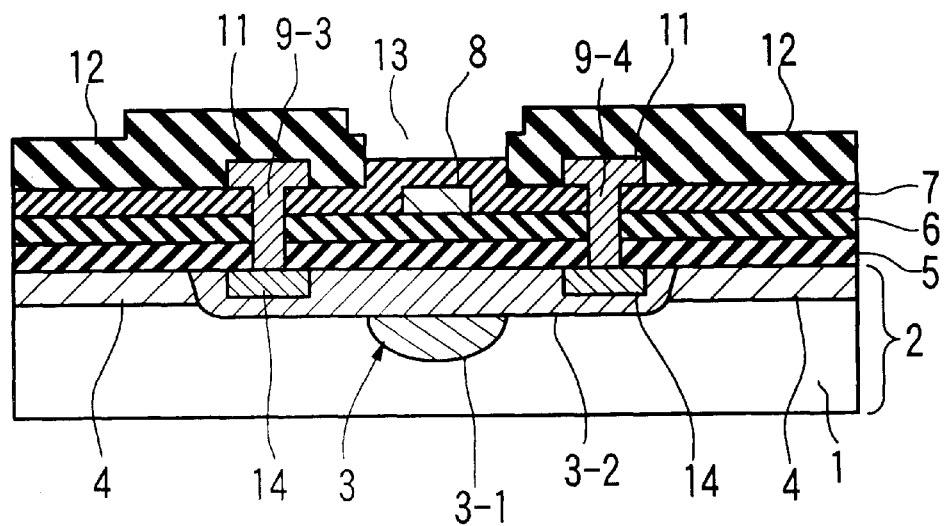
FIG. 3B shows the first embodiment in the present invention taken on the line B—B of FIG. 4.
Figure 4:
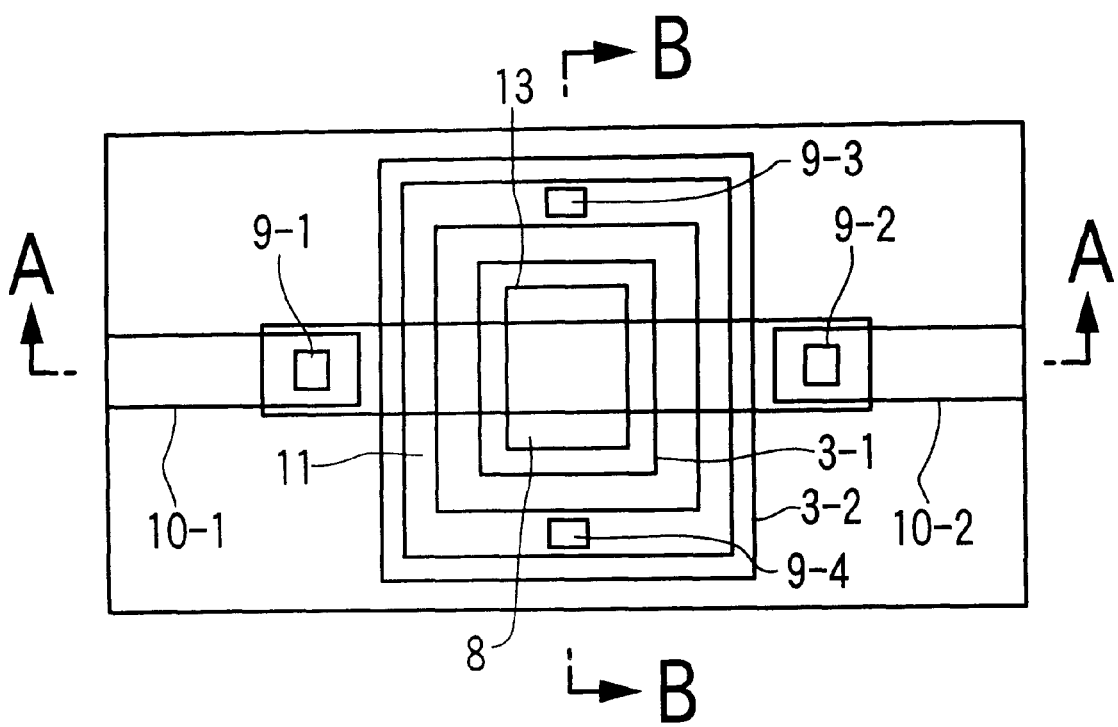
FIG. 4 is a plan view showing the first embodiment in the present invention.

A first embodiment in the present invention will be described below. In the present invention, an N-type well below a fuse is provided with a plurality of N-type wells 3-1, 3-2. FIG. 4 is a plan view showing this embodiment. FIG. 3A is a section view taken on the line A—A of FIG. 4. FIG. 3B is a section view taken on the line B—B of FIG. 4. The structure of the semiconductor device in this embodiment will be described below with reference to the above-mentioned drawings.

A P-type semiconductor region 2 is provided with a P-type semiconductor substrate 1 and a P-type well 4. A field oxide film 5, a first interlayer insulating film 6, a polysilicon film 8, a second interlayer insulating film 7 and a cover film 12 are formed above the P-type semiconductor region 2 in that order. The polysilicon film 8 is a wiring layer as a fuse element. The polysilicon film 8 is connected through contact regions 9-1, 9-2 to wiring regions 10-1, 10-2 formed on the second interlayer insulating film 7. An opening 13 is formed in the cover film 12. A laser light is radiated to the opening 13.

A deep N-type well 3-1 and a shallow N-type well 3-2 are formed to prevent the laser light from penetrating the P-type semiconductor region 2 when the laser light is radiated to the polysilicon film 8. Hereafter, the N-type wells 3-1, 3-2 are collectedly referred to as an N-type well whole region 3.

To bias the N-type well whole region 3, a ring wire 11 is connected through contact regions 9-3, 9-4 and an N-type high concentration impurity layer 14 to the shallow N-type well 3-2. The N-type high concentration impurity layer 14 is formed to reduce the contact resistance between the ring wire 11 and the shallow N-type well 3-2.

Incidentally, the wiring regions 10-1, 10-2 and the ring wire 11 are formed of aluminum and the like. The wiring regions 10-1, 10-2 are connected to a power supply and a circuit, the ring wire 11 is supplied with the bias voltage (Vcc), and the P-type semiconductor region 2 is connected to the ground potential (GND), respectively, although they are not shown.

In this embodiment, the deep N-type well 3-1 is preferably formed such that the bottom of the deep N-type well 3-1 substantially overlaps the opening 13. This is intended to improve the reliability when the laser light is radiated to an end of the opening 13.

The shallow N-type well 3-2 is formed to substantially overlap the range between the contact regions 9-3 and 9-4 of the ring wire 11. This is intended to bias the deep N-type well 3-1.

In this embodiment, the N-type well whole region 3 is formed as illustrated to achieve the high reliability of the semiconductor device and the miniaturization of the occupation region occupied by the semiconductor device. Mainly, the deep N-type well 3-1 contributes to the high reliability, and the shallow N-type well 3-2 contributes to the miniaturization of the occupation region.

The method of manufacturing a semiconductor device in the embodiment will be described below with reference to FIGS. 5A to 5E. However, since processes other than the process of forming the N-type well whole region 3 are well known, the explanations thereof are omitted.

Figure 5A:
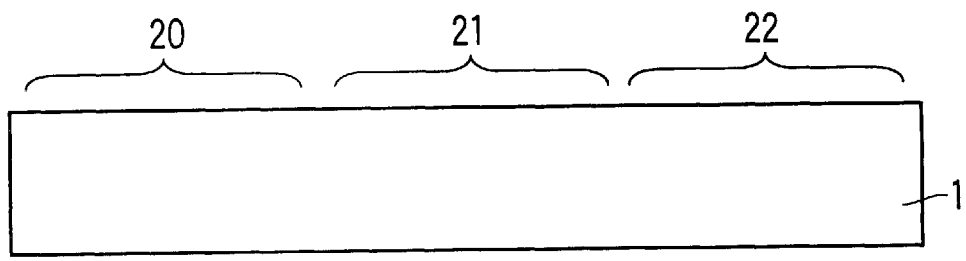
FIG. 5A is a section view showing a process of manufacturing the first embodiment in the present invention.

At first, the P-type semiconductor substrate 1 is prepared (FIG. 5A). In this embodiment, the semiconductor device (the fuse device), a P channel type transistor and an N channel type transistor are formed in a main surface of the P-type semiconductor substrate 1 (refer to numerals 20, 21 and 22). In this case, the reference number 20 denotes a region to form the fuse device. The reference number 21 denotes a region to form the P channel type transistor. The reference number 22 denotes a region to form the N channel type transistor (the type formed in a P-type well).

Figure 5B:
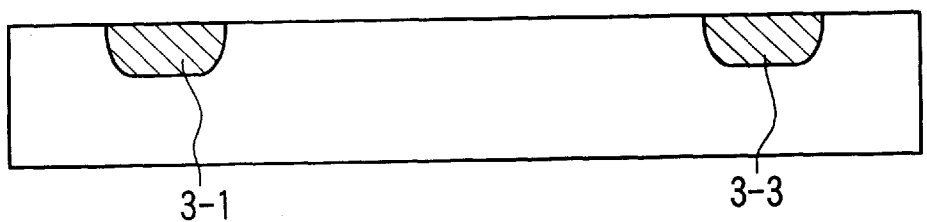
FIG. 5B is a section view showing a process of manufacturing the first embodiment in the present invention.

Next, a phosphor is selectively implanted or injected into the fuse device formation region 20 and the N channel type transistor formation region 22. In this case, the phosphor is implanted in a condition of 4E12 and 150 keV to form the N-type wells 3-1 and 3-3 (FIG. 5B). At this time, the phosphor is implanted into the same range as the opening 13 of the cover film 12 formed later to form the N-type well 3-1.

Figure 5C:
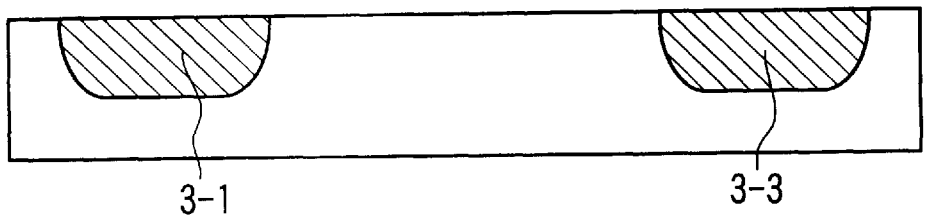
FIG. 5C is a section view showing a process of manufacturing the first embodiment in the present invention.

Continuously, a thermomigration is performed at 1200° C. for 4 hours to push in the N-type wells 3-1 and 3-3. Accordingly the deep N-type wells 3-1 and 3-3 are formed (FIG. 5C).

Figure 5D:
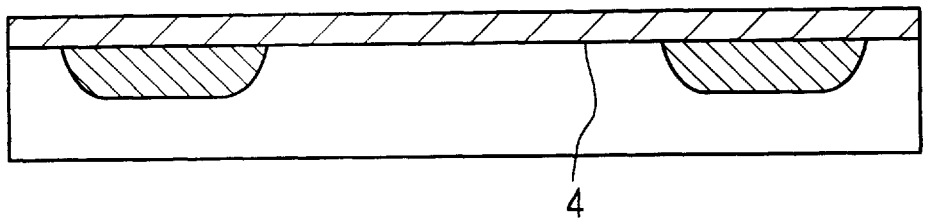
FIG. 5D is a section view showing a process of manufacturing the first embodiment in the present invention.

Continuously, a boron is implanted into the whole surface of the semiconductor substrate 1 in a condition of 5E12 and 400 keV to form the P-type well 4 (FIG. 5D).

Figure 5E:
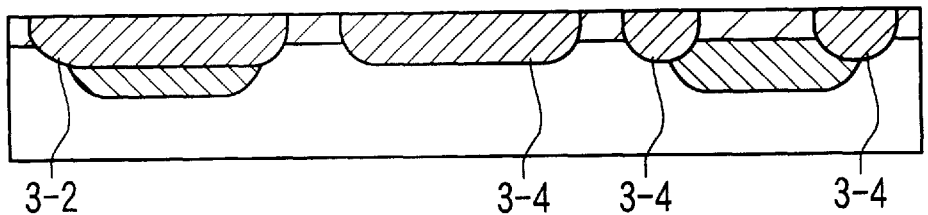
FIG. 5E is a section view showing a process of manufacturing the first embodiment in the present invention.
Figure 6A:
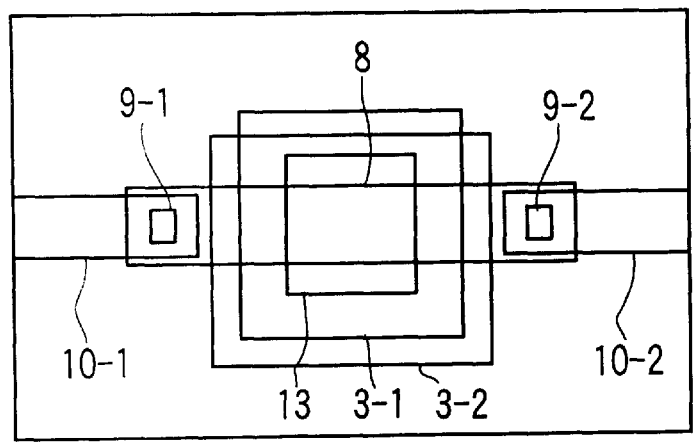
FIG. 6A is a plan view showing another embodiment in the present invention.
Figure 6B:
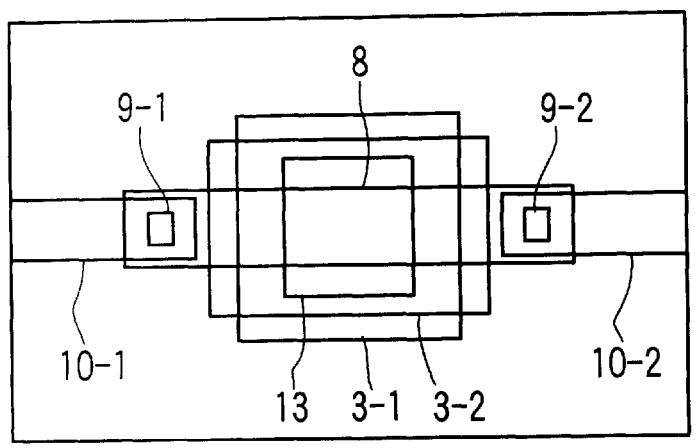
FIG. 6B is a plan view showing still another embodiment in the present invention.
Figure 6C:
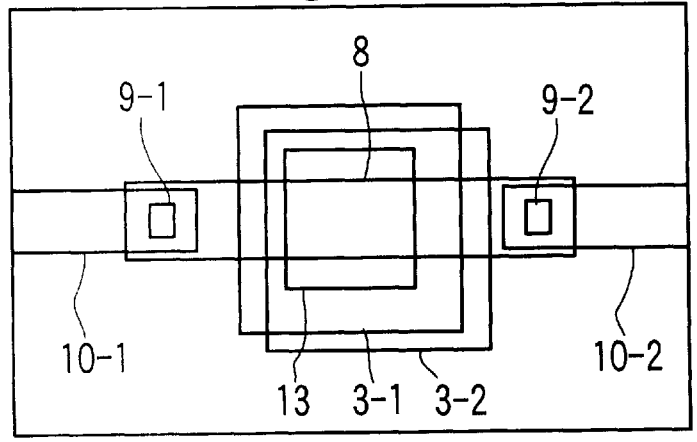
FIG. 6C is a plan view showing still another embodiment in the present invention.

Again, a phosphor is implanted in a condition of 1.7E13 and 900 keV to form the shallow wells 3-2 and 3-4 (FIG. 5E). At this time, the phosphor is implanted into the same range as the outer shape of the ring wire 11 formed later to form the N-type well 3-2.

The N-type wells 3-3 and 3-4 have the size defined in accordance with the design rule of a transistor to be formed. After that, the fuse device, the P channel type transistor and the N channel type transistor are formed in the respective regions 20, 21 and 22 by using the well-known manner.

As can be understood from the above-mentioned explanations, in this embodiment, the N-type well whole region 3 is provided with the deep N-type well 3-1 formed by the thermomigration and the shallow N-type well 3-2 formed by the ion implantation.

That is, in this embodiment, it is not necessary that the deep N-type well 3-1 is connected directly to the ring wire 11. Thus, the ion is implanted into the range narrower than that of the conventional technique to perform the thermomigration. Hence, even if the deep N-type well 3-1 is formed sufficiently deeply, the occupation region of the semiconductor device is never expanded.

Moreover, since the shallow N-type well 3-2 is intended to connect the deep N-type well 3-1 to the ring wire 11, the thermomigration is not required, or the short thermomigration may be allowable. Therefore, the occupation region of the semiconductor device is never expanded because of the shallow N-type well 3-2.

Incidentally, even if the thermomigration of the shallow N-type well 3-2 is not performed, the shallow N-type well 3-2 is slightly expanded as illustrated, by the thermal history in the process of forming the transistor and the like after the shallow N-type 3-2 well is formed.

Moreover, in this embodiment, the forming of the deep N-type well 3-1 and the shallow N-type well 3-2 can be simultaneous with forming of a transistor region of a triple well, such as the N channel type transistor formation region 22. Thus, the specific process to the deep N-type well 3-1 and the shallow N-type well 3-2 is not necessary.

FIGS. 6A to 6C and FIGS. 7A and 7B show another embodiments in the present invention. The illustrated respective plan views show the relation between the deep N-type well 3-1 and the shallow N-type well 3-2. The same numerals are given to the same portions as those of the first embodiment. Incidentally, the ring wire 11 and the contact regions 9-3 and 9-4 are omitted for the obvious illustrations.

In the first embodiment shown in FIG. 4, the shallow N-type well 3-2 is formed such that a part of the shallow N-type well 3-2 overlaps the whole of the deep N-type well 3-1. However, the positional relations as shown in FIGS. 6A to 6C and 7A and 7B may be allowable. That is, the shallow N-type well 3-2 may be formed to connect the contact regions 9-3 and 9-4 of the ring wire 11 to the deep N-type well 3-1. Hence, it is not always necessary that the shallow N-type well 3-2 overlap the whole of the deep N-type well 3-1.

That is, the contact regions 9-3 and 9-4 of the ring wire 11 are not always formed in the positions shown in FIG. 4. Thus, the position of the region to form the shallow N-type well 3-2 may be properly changed as illustrated in accordance with the positions of such contact regions 9-3 and 9-4.

Figure 7A:
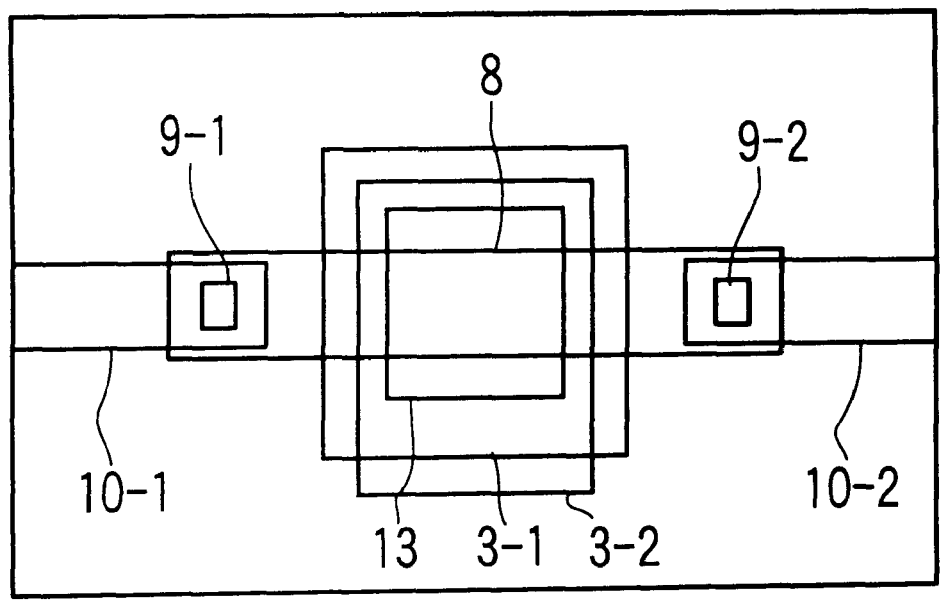
FIG. 7A is a plan view showing still another embodiment in the present invention.
Figure 7B:
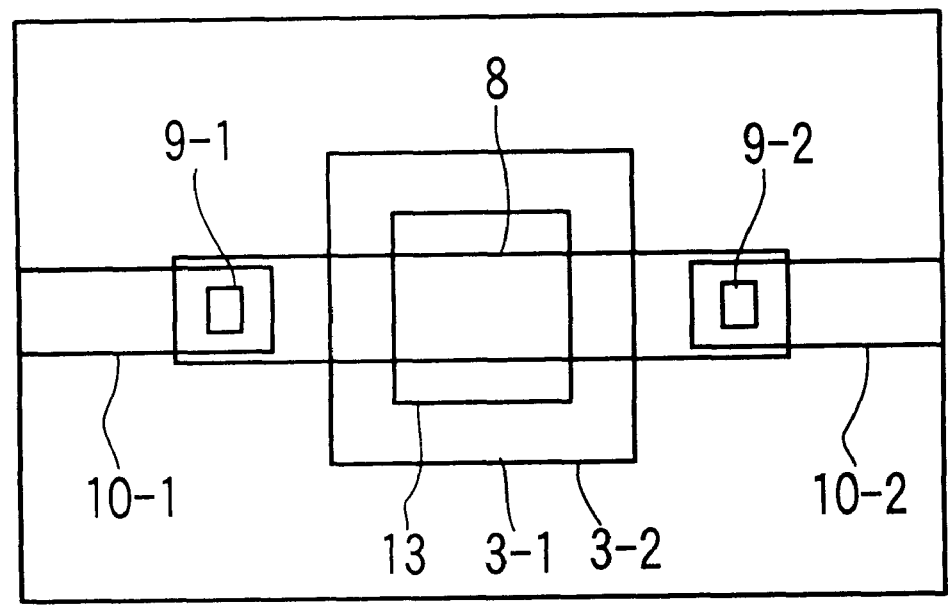
FIG. 7B is a plan view showing still another embodiment in the present invention.

The reliability to the laser light radiation becomes at its maximum if the whole of the region of the thermomigrated deep N-type well 3-1 substantially overlaps the whole of the region of the shallow N-type well 3-2, as shown in FIG. 7B.

In the present invention, it is not always necessary that the depth of the N-type well whole region 3 is provided with the two levels as the embodiments. Thus, it may be provided with a plurality of levels.

It is not always necessary that the bias potentials of the N-type well whole region 3 and the P-type semiconductor substrate 1, if the portion between them is in the state of the PN converse conjunction, are the bias potential Vcc or the ground potential GND.

The N-type well whole region 3 may be at the floating state. In this case, the P-type semiconductor substrate 1 may be biased to the potential at which the P-type semiconductor substrate 1 and the N-type well whole region 3 become in the state of the PN converse conjunction when the fuse element 8 contacts the P-type semiconductor substrate 1 and the N-type well whole region 3.

The P-type well may be used instead of the N-type well, if the N-type semiconductor substrate is used.

As mentioned above, the present invention has the effect of simultaneously achieving the high reliability to the laser light radiation and the miniaturization of the semiconductor device, by forming the deep N-type well below the opening from which the laser light is radiated to the fuse element, and forming the shallow N-type well between the deep N-type well and the contact region of the ring wire to supply the bias voltage to the deep N-type well.

What is claimed is:

1. A semiconductor device comprising:
   a first semiconductor layer;
   a first well formed in a surface of said first semiconductor layer;
   a second semiconductor layer formed on said first semiconductor layer;
   a second well formed in said second semiconductor layer to be wider than said first well in a lateral direction;
   an insulating layer formed on said second semiconductor layer;
   a fuse layer formed on said insulating layer;
   another insulating layer formed on said fuse layer such that a part of said fuse layer is exposed; and
   electrodes formed outside said exposed part of said fuse layer, and connected to said second semiconductor layer.

2. A semiconductor device according to claim 1, wherein said fuse layer is a polysilicon film.

3. A semiconductor device according to claim 1, wherein said electrodes are connected to said second well.

4. A semiconductor device according to claim 1, wherein said electrodes are connected to an external bias voltage source and through said insulating layer formed on said second semiconductor layer to allow said first well and said second well to be biased.

5. The semiconductor device of claim 4, such that said second well has an area that substantially overlaps an area formed by said electrodes.

6. The semiconductor device of claim 5, wherein a depth of said first well in the vertical direction is deeper than that of said second well.

7. The semiconductor device of claim 6, wherein a bottom of said first well comprises an area that substantially overlaps an area of said part of said fuse layer that is exposed.

8. A semiconductor device according to claim 1, wherein said first well and said second well are in contact with each other.

9. A semiconductor device according to claim 1, wherein said first semiconductor layer and said second semiconductor layer are formed as a single semiconductor layer.

10. A semiconductor device according to claim 1, wherein said first and second wells have a conductive type opposite to those of said first semiconductor layer and said second semiconductor layer.

11. A semiconductor device according to claim 1, wherein said first well is formed to have a first surface plane portion in said first semiconductor layer, and wherein said exposure portion of said fuse layer is formed above said first surface plane portion.

12. A semiconductor device according to claim 1, wherein said first well is formed to have a first surface plane portion in said first semiconductor layer, wherein said second well is formed to have a second surface plane portion in said second semiconductor layer, and wherein at least a part of said first surface plane portion is formed to overlap a part of said second surface plane portion.

13. A semiconductor device according to claim 1, wherein said first well is formed to have a first surface plane portion in said first semiconductor layer, wherein said second well is formed to have a second surface plane portion in said second semiconductor layer, and wherein a whole of said first surface plane portion is formed to overlap a part of said second surface plane portion.

14. A semiconductor device according to claim 1, wherein said first well is formed to have a first surface plane portion in said first semiconductor layer, wherein said second well is formed to have a second surface plane portion in said second semiconductor layer, and wherein a whole of said first surface plane portion is formed to substantially overlap a whole of said second surface plane portion.

15. A semiconductor device according to claim 1, wherein said second well is formed to have a second surface plane portion in said second semiconductor layer, and wherein said second surface plane portion is formed to be externally wider than said exposure portion of said fuse layer.

16. A semiconductor device according to claim 1, wherein said second well is formed to have a second surface plane portion in said second semiconductor layer, and wherein said semiconductor device further comprises electrodes formed at laterally internal portions of said second surface plane portion.

17. A semiconductor device according to claim 16, wherein said electrodes are connected to an external bias voltage source and through said insulating layer formed on said second semiconductor layer to allow said first well and said second well to be biased.

18. A semiconductor device according to claim 1, wherein said second well is formed to have a second surface plane portion in said second semiconductor layer, wherein said semiconductor device further comprises a bias voltage supplying wire formed laterally outside said exposure portion of said fuse layer, and laterally inside said second surface plane portion, wherein said bias voltage supplying wire supplies a bias voltage to said first well, and said second well and to said electrodes formed outside said exposure portion of said fuse layer.

19. A semiconductor device comprising:

a fuse layer;

an insulating layer formed below said fuse layer;

a semiconductor layer formed below said insulating layer;

protecting means formed between said insulating layer and said semiconductor layer for protecting a current from flowing into said semiconductor layer;

bias means for supplying a bias voltage; and connecting means for connecting said bias means to said protecting means, while protecting the current from flowing into said semiconductor layer.

20. A semiconductor device according to claim 19, wherein said protecting means and said connecting means protect a leakage current from flowing from said fuse layer to said semiconductor layer when a laser light emitted to said fuse layer penetrates said insulating layer.

21. A semiconductor device according to claim 19, wherein said connecting means is formed such that a surface plane portion of said protecting means is smaller than that of said connecting means.

* * * * *